United States Patent
Park et al.

(12) 
(10) Patent No.: US 6,534,601 B1
(45) Date of Patent: Mar. 18, 2003

(54) FLAME RETARDANT EPOXY RESIN MODIFIED WITH PHOSPHORUS AND SILICON

(75) Inventors: Chongsoo Park, Kwangmyung (KR); Jaeho Choi, Seoul (KR); Bonggoo Choi, Seoul (KR); Taekyoo Shin, Inchon (KR)

(73) Assignee: Kukdo Chemical Co., Ltd., Seoul (KR)

( * ) Notice: Subject to any disclaimer, the term of this patent is extended or adjusted under 35 U.S.C. 154(b) by 0 days.

(21) Appl. No.: 10/029,854

(22) Filed: Dec. 31, 2001

(30) Foreign Application Priority Data

Oct. 29, 2001 (KR) ........................................ 2001-66642

(51) Int. Cl.$^7$ .............................................. C08G 77/38
(52) U.S. Cl. .......................... 525/476; 525/523; 528/27; 528/33; 528/43
(58) Field of Search ................................. 525/476, 523; 528/27, 33, 43

(56) References Cited

FOREIGN PATENT DOCUMENTS

JP          62041317        *  2/1987

\* cited by examiner

*Primary Examiner*—Robert Dawson
*Assistant Examiner*—D. Aylward
(74) *Attorney, Agent, or Firm*—Bacon & Thomas, PLLC

(57) ABSTRACT

Disclosed is an epoxy resin modified with phosphorus and silicon having an synergistically improved flame retardant property, prepared by reacting an epoxy resin with phosphorus and silicon. The contents of phosphorus and silicon in the epoxy resin are 2.0 wt % to 3.2 wt % and 0.5 wt % to 2.2 wt %, respectively. The epoxy resin according to the present invention will be applicable to the preparation of electrical circuit boards.

4 Claims, No Drawings

FLAME RETARDANT EPOXY RESIN MODIFIED WITH PHOSPHORUS AND SILICON

TECHNICAL FIELD

The present invention relates to a flame retardant epoxy resin, and more particularly, the present invention relates to a flame retardant epoxy resin modified with phosphorus and silicon which is obtainable by reacting a phosphorus-modified epoxy resin which is formed by reacting an epoxy resin with a phosphorus-containing compound, with silicon.

BACKGROUND ART

In recent years, many industrial fields, including electrical applications, transport equipments, and construction materials, have demanded flame retardant plastic materials which are not burned by heat or flame. It is known that materials showing flame retardant properties are generally compounds of elements belonging to groups 5 and 7 in the periodic table of elements. For example, compounds of halogens, phosphorus, and antimony are particularly known to be effective flame retardants.

Among halides, chlorine and bromine show the greatest flame retardant effects, and bromine is more powerful than chlorine. Such differences among halides in their flame retardant effects are attributable to the differences of bond strength between bromine or chlorine and carbon. The bond strength between carbon and bromine is 65 kcal/mol and it is weaker than the strength between carbon and chlorine, which is 81 kcal/mol. Therefore, compounds of carbon and bromine can be decomposed more readily than compounds of carbon and chlorine by combustion, thereby producing bromides of low molecular weight having flame retardant effects.

Thus, bromine-containing flame retardants are mainly used to provide flame retardant properties to an epoxy resin. Also, phosphorus-containing retardant systems and halogen (bromine) and phosphorus containing retardant systems are widely used. For example, Korean Patent Publication No. 1995-6533 discloses N-tribromophenylmaleimide as a flame retardant system which is capable of reacting with polymeric substances.

Use of phosphorus-containing flame retardant systems is preferable to compounds of halogens, particularly bromine, in an environmental aspect. For example, Korean Patent No. 215639 discloses a flame retardant system containing red phosphorus as an additive type. Japanese Patent Publication No. Hei 4-11662 discloses a flame retardant system which is obtainable by reacting 2-(6-oxide-6-H-dibenzo<c,e><1,2> oxa phosphorin-6-yl)-1,4-benzenediol with a polymeric resin, as a reactive type.

DISCLOSURE OF THE INVENTION

The present inventors have found that as a halogen-free flame retardant epoxy resin, the conventional flame retardant system prepared by a reaction of the known phosphorus compound, 2-(6-oxide-6-H-dibenzo<c,e><1,2> oxa phosphorin-6-yl-1,4-benzenediol and a epoxy resin may be improved in flame retardant effects by additional reaction with a given amount of silicon.

It is therefore, an object of the present invention is to provide a halogen-free flame retardant system with an improved flame retardant effect.

It is another object of the present invention is to provide a flame retardant system having an excellent flame retardant effect without containing halogens, which is obtainable by introducing silicon to a phosphorus-modified epoxy resin prepared by reaction of a known phosphorus-containing compound and an epoxy resin.

DISCLOSURE OF THE PRESENT INVENTION

The present invention is directed to a novel flame retardant epoxy resin modified with phosphorus and silicon. According to the present invention, a phosphorus-modified epoxy resin prepared by an epoxidation of the known phosphorus compound, 2-(6-oxide-6-H-dibenzo<c,e><1,2> oxa phosphorin-6-yl-1,4-benzenediol is reacted with a reactive silicon compound containing a methoxy group in its molecular structure to provide an improved flame retardant effect to said phosphorus-modified epoxy resin.

Thus, the flame retardant epoxy resin modified with phosphorus and silicon according to the present invention is prepared by reacting one or more epoxy resin selected from a group consisting of bisphenol A epoxy resins, bisphenol F epoxy resins, bisphenol S epoxy resins, bisphenol M epoxy resins and bisphenol AD epoxy resins with a compound having a structure represented by the following formula 1:

[Formula 1]

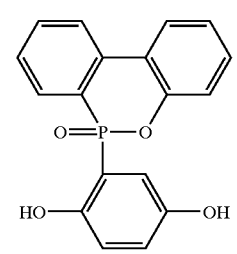

to form a phosphorus-modified epoxy resin having a structure represented by the following formula 2:

[Formula 2]

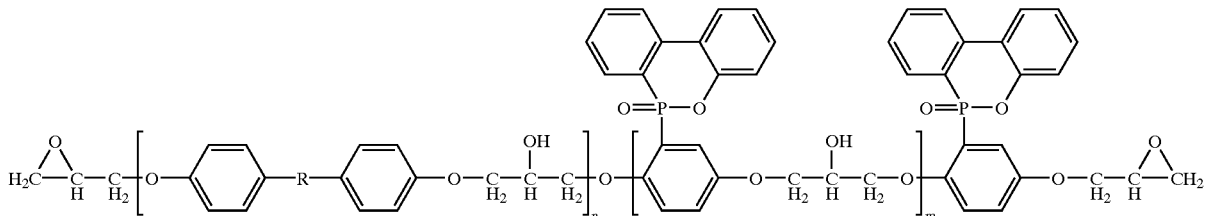

in which R is

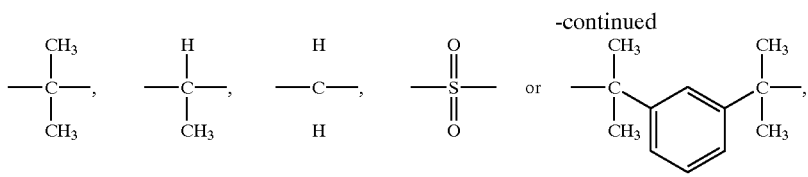

n and m are independently an integer of from 0 to 5, and then reacting the phosphorus-modified epoxy resin with a compound having a structural unit represented by the following formula 3:

[Formula 3]

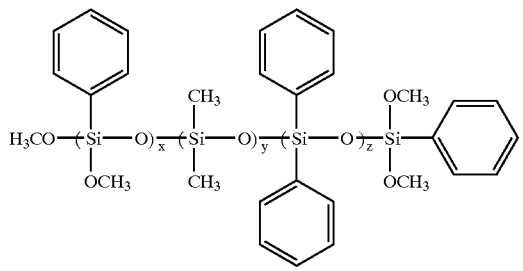

in which x, y and z are independently 0, 1, or 2, to form an epoxy resin modified with phosphorus and silicon containing 2.0 wt % to 3.2 wt % of phosphorus and 0.5 wt % to 2.2 wt % of silicon and having a structural unit represented by the following formula 4:

present invention, the amount of the ODOPB which reacts with the epoxy resin is an amount which ensures that the content of phosphorus in the resulting epoxy resin modified with phosphorus and silicon is 2.0 wt % to 3.2%.

If the content of phosphorus in the epoxy resin modified with phosphorus and silicon which is finally obtained according to the present invention is less than 2.0 wt %, the desired level of the flame retardant effect cannot be achieved. If the content of phosphorus exceeds 3.2 wt %, though attaining a superior flame retardant effect, there occurs a problem that the viscosity of the resin is increased and discoloration occurs.

Examples of commercially available ODOPB include HCA-HQ produced by Sanko Co., Ltd. (Japan) and DOPO-BQ produced by Forte (Taiwan).

The reaction of the epoxy resin and the ODOPB is carried out for 3 to 8 hours at a temperature of 140 to 190° C. using phosphorus, imidazoles or tertiary amines as a catalyst.

The epoxy resin which is used in the present invention includes bisphenol A epoxy resins, bisphenol F epoxy resins, bisphenol S epoxy resins, bisphenol M epoxy resins or bisphenol AD epoxy resins, or mixtures thereof, with bisphenol A epoxy resins or bisphenol F epoxy resins being preferable.

[Formula 4]

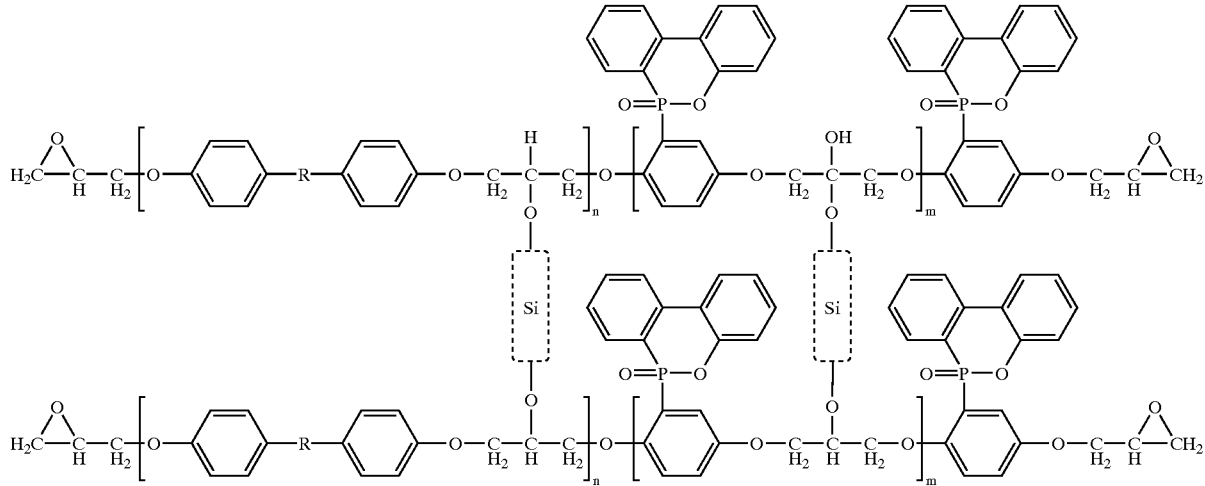

in which squares drawn with dotted lines represent the structural unit of formula 3.

The present invention is described in detail below.

The reactive phosphorus compound used in the present invention is 2-(6-oxide-6-H-dibenzo<c,e><1,2> oxa phosphorin-6-yl-1,4-benzenediol (herein after referred to as ODOPB), the compound represented by the above formula 1. This compound is commonly used as a substitute for the bromine-containing flame retardant considering the environmental aspect.

The ODOPB reacts with an epoxy group in a resin molecule to form a phosphorus-modified epoxy resin. In the The phosphorus-modified epoxy resin resulting from the reaction of the epoxy resin and the ODOPB is then reacted with a reactive silicon compound represented by the above formula 3 to finally form an epoxy resin modified with phosphorus and silicon of the above formula 4.

The amount of the silicon-containing compound (formula 3) reacted with the phosphorus-modified epoxy resin is an amount sufficient to ensure that the content of silicon contained in the epoxy resin modified with phosphorus and silicon which is finally obtained according to the present invention is 0.5 wt % to 2.2 wt %.

If the content of silicon in the epoxy resin modified with phosphorus and silicon is less than 0.5 wt %, the synergistic effect on the flame retardant property is insignificant. If the content of silicon exceeds 2.2 wt %, when the phosphorus-modified epoxy resin reacts with the silicon-containing compound (formula 3), an excess of hydroxy groups of the epoxy resin react with the silicon compound, which may cause gelation of the resin.

The reaction of the silicon-containing compound (Formula 3) and the phosphorus-modified epoxy resin is carried out for 3 to 8 hours at a temperature of 150 to 180° C. in the absence or presence of a catalyst including base or tin compound.

It is believed that the reactive silicon having active methoxy groups in the compound of the above formula 3 mainly reacts with a hydroxy group in the epoxy resin. This may be presumed based on the fact that when a reaction between reactive silicons occurs under the same reaction conditions, methanol is not or is little detected and that if the methoxy groups of reactive silicon reacts to the epoxy groups in the epoxy resin, the increase of the equivalent should be greater than when reacting to —OH groups in the epoxy resin but that's not the case, which indicates that the methoxy groups of the reactive silicon reacts to the hydroxy groups in the epoxy resin.

Examples of commercially available silicon-containing compounds having active methoxy groups in the molecule include TSR-165 produced by Toshiba Corp. (Japan) and Z-6018 produced by Dow Chemical Co. (U.S.A.)

The epoxy resin of the present invention is cured by a curing agent. The curing agent which can be used in the present invention include materials generally known in the art, for example, acid anhydrides, polyamides, amines, phenol novolacs, cresol novolacs, and the like. Commonly, dicyandiamide, diaminodiphenylmethane, diaminodiphenylsulphone and the like are used.

In addition to the curing agent, the epoxy resin of the present invention may comprise additives known in the art as needed, including fillers, pigments, colorants, and flame retardant adjuvants.

Also, in order to improve the thermal resistance, the epoxy resin modified with phosphorus and silicon according to the present invention may further comprise one or more compounds selected from the group consisting of cresol novolac epoxy resins, phenol novolac epoxy resins and BPA novolac epoxy resins. The amount of these compounds to be added is preferably 5 wt % to 20 wt %. If the amount is less than 5 wt %, the thermal resistance is small. If the amount exceeds 20 wt %, the viscosity of the resin increases unduly, and in the preparation of prepreg the surface of the resin is not clean and adhesion to glass fibers is poor.

Now, the present invention will be described in detail with reference to following examples. These examples, however, are intended to illustrate the present invention and should not be construed as limiting the scope of the present invention.

EXAMPLE 1

756.5 g of YD-128, a bisphenol A epoxy resin (Kukdo Chemical Co., Ltd., Korea, EEW: 186 g/eq) was bulk polymerized with 209 g of HCA-HQ (Sanko Co., Ltd., Japan) using BTMAC (Benzyl Trimethyl Ammonium Chloride) as a catalyst at a reaction temperature of 140 to 190° C. for 6 hours to form a phosphorus-modified epoxy resin.

Then, the resulting phosphorus-modified epoxy resin was further reacted with 34.5 g of TSR-165 (Toshiba Corp., Japan) using DBTDL (Dibutyl Tin Dilaurate) as a catalyst at a reaction temperature of 140 to 190° C. for 6 hours to form an epoxy resin modified with phosphorus and silicon (EEW: 420.2 g/eq), in which the contents of phosphorus and silicon are 2 wt % and 0.5 wt %, respectively, based on the total weight of the produced epoxy resin modified with phosphorus and silicon.

EXAMPLE 2

722 g of YD-128 was bulk polymerized with 209 g of HCA-HQ using BTMAC as a catalyst at a reaction temperature of 140 to 190° C. for 6 hours to form a phosphorus-modified epoxy resin.

Then, the resulting phosphorus-modified epoxy resin was further reacted with 69 g of TSR-165 using DBTDL as a catalyst at a reaction temperature of 140 to 190° C. for 6 hours to form an epoxy resin modified with phosphorus and silicon (EEW: 448.4 g/eq), in which the contents of phosphorus and silicon are 2 wt % and 1 wt %, respectively, based on the total weight of the produced epoxy resin modified with phosphorus and silicon.

EXAMPLE 3

687.5 g of YD-128 was bulk polymerized with 209 g of HCA-HQ using BTMAC as a catalyst at a reaction temperature of 140 to 190° C. for 6 hours to form a phosphorus-modified epoxy resin.

Then, the resulting phosphorus-modified epoxy resin was further reacted with 103.5 g of TSR-165 using DBTDL as a catalyst at a reaction temperature of 140 to 190° C. for 6 hours to form an epoxy resin modified with phosphorus and silicon (EEW: 489.3 g/eq), in which the contents of phosphorus and silicon are 2 wt % and 1.5 wt %, respectively, based on the total weight of the produced epoxy resin modified with phosphorus and silicon.

EXAMPLE 4

653 g of YD-128 was bulk polymerized with 209 g of HCA-HQ using BTMAC as a catalyst at a reaction temperature of 140 to 190° C. for 6 hours to form a phosphorus-modified epoxy resin.

Then, the resulting phosphorus-modified epoxy resin was further reacted with 138 g of TSR-165 using DBTDL as a catalyst at a reaction temperature of 140 to 190° C. for 6 hours to form an epoxy resin modified with phosphorus and silicon (EEW: 505.7 g/eq), in which the contents of phosphorus and silicon are 2 wt % and 2 wt %, respectively, based on the total weight of the produced epoxy resin modified with phosphorus and silicon.

EXAMPLE 5

735.5 g of YD-128 was bulk polymerized with 230 g of HCA-HQ using BTMAC as a catalyst at a reaction temperature of 140 to 190° C. for 6 hours to form a phosphorus-modified epoxy resin.

Then, the resulting phosphorus-modified epoxy resin was further reacted with 34.5 g of TSR-165 using DBTDL as a catalyst at a reaction temperature of 140 to 190° C. for 6 hours to form an epoxy resin modified with phosphorus and silicon (EEW: 440.3 g/eq), in which the contents of phosphorus and silicon are 2.2 wt % and 0.5 wt %, respectively, based on the total weight of the produced epoxy resin modified with phosphorus and silicon.

EXAMPLE 6

704.3 g of YD-128 was bulk polymerized with 261.2 g of HCA-HQ using BTMAC as a catalyst at a reaction temperature of 140 to 190° C. for 6 hours to form a phosphorus-modified epoxy resin.

Then, the resulting phosphorus-modified epoxy resin was further reacted with 34.5 g of TSR-165 using DBTDL as a catalyst at a reaction temperature of 140 to 190° C. for 6 hours to form an epoxy resin modified with phosporus and silicon (EEW: 480.4 g/eq), in which the contents s ot phosphorus and silicon are 2.5 wt %, and 0.5 wt %, respectively, based on the total weight of the produced epoxy resin modified with phosphorus and silicon.

EXAMPLE 7

683.3 g of YD-128 was bulk polymerized with 282.2 g of HCA-HQ using BTMAC as a catalyst at a reaction temperature of 140 to 190° C. for 6 hours to form a phosphorus-modified epoxy resin.

Then, the resulting phosphorus-modified epoxy resin was further reacted with 34.5 g of TSR-165 using DBTDL as a catalyst at a reaction temperature of 140 to 190° C. for 6 hours to form an epoxy resin modified with phosphorus and silicon (EEW: 510.2 g/eq), in which the contents of phosphorus and silicon are 2.7 wt % and 0.5 wt %, respectively, based on the total weight of the produced epoxy resin modified with phosphorus and silicon.

EXAMPLE 8

635.5 g of YD-128 was bulk polymerized with 230 g of HCA-HQ using BTMAC as a catalyst at a reaction temperature of 140 to 190° C. for 6 hours to form a phosphorus-modified epoxy resin.

Then, the resulting phosphorous-modified epoxy resin was further reacted with 34.5 g of TSR-165 using DBTDL as a catalyst at a reaction tenperature of 140 to 190° C. for 6 hours, followed by the addition of 100 g of YDCN-500-900P, a cresol novolac epoxy resin (Kukdo Chemical Co., Ltd., Korea), to form an epoxy resin modified with phosphorus and silicon (EEW: 460.6 g/eq), in which the contents of phosphorus and silicon are 2.2 wt % and 0.5 wt %, respectively, based on the total weight of the produced epoxy resin modified with phosphorus and silicon.

Comparative Example 1

791 g of YD-128 was bulk polymerized with 209 g of HCA-HQ using BTMAC as a catalyst at a reaction temperature of 140 to 190° C. for 6 hours to form a phosphorus-modified epoxy resin (EEW: 399.6 g/cq).

Curing of the Epoxy Resin and Preparation of Prepreg

In order to examine the flame retardant properties of the epoxy resins prepared in the above Examples 1 to 8 and the Comparative Example 1, the respective epoxy resins were cured using dicyandianide as a curing agent in an amount (g) calculated by dividing 12.6 by the equivalent weight of the epoxy and multiplying the result by 100, and 2-methyl imidazole as a curing accelerator in a amount of 3.3 phr with respect to the dicyandiamide.

The prepreg was prepared in a semi-cured state by curing for 3 minutes at 175° C. 8 pieces of the semi-cured prepreg were pressed at 175° C. under a pressure of 25 kgf/cm$^2$ for 30 minutes and then under a pressure of 50 kgf/cm$^2$ at 175° C. for 30 minutes and cooled with a refrigerant for 15 minutes.

5 specimens of each of the prepregs prepared using the epoxy resins from the Examples and the Comparative Examples were subjected to the flame retardant test according to the procedures set forth in Underwriters' Laboratories, Inc. Bulletin 94, Burning Test for Classifying Materials (UL-94). The results are shown in Table 1 below.

TABLE 1

| No. | | YD-128 | HCA-HQ | TSR-165 (g) | Dcy[1] | YDB-424A80 | YDCN-500–900P | P[2] (wt %) | Si[2] (wt %) | Br | EEW[3] (g/eq) | UL-94 | Tg ( ) | DC[4] (C$^2$/N · m$^2$) |
|---|---|---|---|---|---|---|---|---|---|---|---|---|---|---|
| Invention Example | 1 | 765.6 | 209 | 34.5 | 30 | | | 2 | 0.5 | | 420.2 | V-1 | 133.4 | 4.36 |
| | 2 | 722 | 209 | 69 | 28 | | | 2 | 1 | | 448.4 | V-1 | 133.1 | 3.25 |
| | 3 | 687.5 | 209 | 103.5 | 25.8 | | | 2 | 1.5 | | 489.3 | V-1 | 130.4 | 4.41 |
| | 4 | 653 | 209 | 138 | 24.9 | | | 2 | 2 | | 505.7 | V-1 | 129.7 | 4.19 |
| | 5 | 735.5 | 230 | 34.5 | 28.6 | | | 2.2 | 0.5 | | 440.3 | V-0 | 137 | 4.82 |
| | 6 | 704.3 | 261.2 | 34.5 | 26.2 | | | 2.5 | 0.5 | | 480.4 | V-0 | 138.6 | 5.12 |
| | 7 | 683.3 | 282.2 | 34.5 | 24.7 | | | 2.7 | 0.5 | | 510.2 | V-1 | 132.5 | 5.23 |
| | 8 | 635.5 | 230 | 34.5 | 27.4 | | 100 | 2.2 | 0.5 | | 460.6 | V-0 | 147 | 4.8 |
| Com. Example | 1 | 791 | 209 | | 31.5 | | | 2 | | | 399.6 | x | 133.7 | 4.08 |
| | 2 | | | | 28 | 1000 | | | | 20 | 450 | V-0 | 135 | 4.7 |

Dcy[1]: Dicyandiamide
P[2], Si[2]: weight percent before curing
EEW[3]: Epoxy equivalent weight
DC[4]: Dielectric Constant As shown in the above table, the epoxy resin modified with phosphorus alone did not exhibit any flame retardant property, however, the epoxy resins modified with phosphorus and silicon according to the present invention exhibited the flame retardant properties equal to the bromic flame retardant system. Also, it is noted that the epoxy resins having the contents of phosphorus and silicon of 2.2 wt % and 0.5 wt %, respectively (Example 5), and 2.5 wt % and 0.5 wt %, respectively (Example 6) exhibited the best flame retardant properties.

With the respect to the dielectric constant, when the contents of phosphorus and silicon were 2 wt % and 1 wt %, respectively, the lowest dielectric value was observed.

The thermal resistance showed a tendency to increase with increased phosphorus content, while showing a tendency to decrease slightly with increased silicon content.

In the Example 8 wherein cresol novolac epoxy resin was used, the glass transition temperature was considerably increased.

Industrial Applicability

The flame retardant epoxy resin according to the present invention is a halogen-free flame retardant epoxy resin and has excellent flame retardant properties, and also favorable electrical and thermal properties. Therefore it can be used in the manufacture of printed circuit board (PCB).

What is claimed is:

1. A flame retardant epoxy resin modified with phosphorus and silicon prepared by reacting one or more epoxy resins selected from a group consisting of bisphenol A epoxy resins, bisphenol F epoxy resins, bisphenol S epoxy resins, bisphenol M epoxy resins and bisphenol AD epoxy resins with a compound having a structure represented by the following formula 1:

[Formula 1]

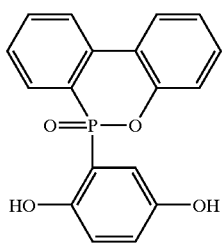

and then reacting the phosphorus-modified epoxy resin with a compound having a structural unit represented by the following formula 3:

[Formula 3]

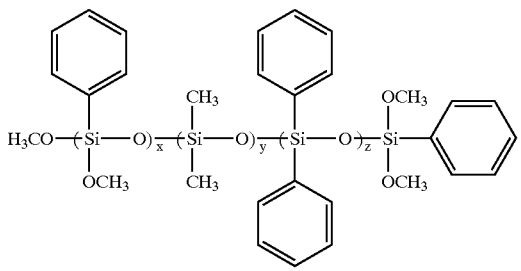

(in which x, y and z are independently 0, 1, or 2) wherein the epoxy resin modified with phosphorus and silicon contains 2.0 wt % to 3.2 wt % of phosphorus and 0.5 wt % to 2.2 wt % of silicon.

2. The flame retardant epoxy resin modified with phosphorus and silicon as set forth in claim 1, wherein the content of phosphorus is 2.2 wt % or 2.5 wt % and the content of silicon is 0.5 wt %.

3. The flame retardant epoxy resin modified with phosphorus and silicon as set forth in claim 1, wherein the content of phosphorus is 2.0 wt % and the content of silicon is 1.0 wt %.

4. The flame retardant epoxy resin modified with phosphorus and silicon as set forth in claim 1, wherein the epoxy resin modified with phosphorus and silicon is further mixed with one or more compounds selected from the group consisting of cresol novolac epoxy resins, phenol novolac epoxy resins and BPA novolac epoxy resins in an amount of 5 wt % to 20 wt %, based on the total weight of the flame retardant epoxy resin modified with phosphorus and silicon.

* * * * *